United States Patent
Truhitte et al.

(10) Patent No.: US 10,163,766 B2
(45) Date of Patent: Dec. 25, 2018

(54) METHODS OF FORMING LEADLESS SEMICONDUCTOR PACKAGES WITH PLATED LEADFRAMES AND WETTABLE FLANKS

(71) Applicant: SEMICONDUCTOR COMPONENTS INDUSTRIES, LLC, Phoenix, AZ (US)

(72) Inventors: Darrell D. Truhitte, Phoenix, AZ (US); James P. Letterman, Jr., Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/357,680

(22) Filed: Nov. 21, 2016

(65) Prior Publication Data

US 2018/0145013 A1    May 24, 2018

(51) Int. Cl.
*H01L 21/00* (2006.01)
*H01L 23/498* (2006.01)
(Continued)

(52) U.S. Cl.
CPC .... *H01L 23/49805* (2013.01); *H01L 21/4842* (2013.01); *H01L 21/561* (2013.01); *H01L 23/49541* (2013.01); *H01L 23/49551* (2013.01); *H01L 23/49838* (2013.01); *H01L 24/48* (2013.01); *H01L 21/568* (2013.01); *H01L 24/45* (2013.01); *H01L 2021/60015* (2013.01); *H01L 2224/45124* (2013.01); *H01L 2224/45139* (2013.01); *H01L 2224/45144* (2013.01); *H01L 2224/45147* (2013.01); *H01L 2224/48247* (2013.01); *H01L 2924/181* (2013.01)

(58) Field of Classification Search
CPC . H01L 33/20; H01L 2924/181; H01L 21/568; H01L 26/96; H01L 24/96; H01L 2224/04105
USPC ............... 438/112, 113, 125, 127, 126
See application file for complete search history.

(56) References Cited

U.S. PATENT DOCUMENTS

| 5,327,008 A | 7/1994 | Djennas et al. |
| 5,866,939 A | 2/1999 | Shin et al. |

(Continued)

FOREIGN PATENT DOCUMENTS

| WO | 2003103038 A1 | 12/2003 |
| WO | 2006105733 A1 | 10/2006 |

OTHER PUBLICATIONS

Vibratory Plating Units Combining rack plating quality with barrel plating production at significant savings, Bulletin 901, Technic Inc, Equipment Division, www.technic,com , Downloaded Jan. 15, 2014.

(Continued)

*Primary Examiner* — S. V. Clark
(74) *Attorney, Agent, or Firm* — IPTechLaw

(57) ABSTRACT

A leadless package with wettable flanks is formed by providing a substrate and plating a metal layer onto the substrate to form a contact on the substrate extending across a saw street. An encapsulant is deposited over the contact. The substrate is removed to expose the contact and encapsulant. The encapsulant and contact are singulated. In some embodiments, the substrate includes a ridge, and the contact is formed over the ridge.

19 Claims, 8 Drawing Sheets

(51) Int. Cl.
*H01L 23/00* (2006.01)
*H01L 21/56* (2006.01)
*H01L 21/48* (2006.01)
*H01L 23/495* (2006.01)
*H01L 21/60* (2006.01)

(56) References Cited

U.S. PATENT DOCUMENTS

| | | | |
|---|---|---|---|
| 5,900,676 A | 5/1999 | Kweon et al. |
| 5,969,411 A | 10/1999 | Fukaya |
| 5,976,912 A | 11/1999 | Fukutomi et al. |
| 6,001,671 A | 12/1999 | Fjelstad |
| 6,130,473 A | 10/2000 | Mostafazadeh et al. |
| 6,143,981 A | 11/2000 | Glenn |
| 6,193,858 B1 | 2/2001 | Hradil et al. |
| 6,229,200 B1 | 5/2001 | McLellan et al. |
| 6,242,281 B1 | 6/2001 | McLellan et al. |
| 6,255,740 B1 | 7/2001 | Tsuji et al. |
| 6,294,100 B1 | 9/2001 | Fan et al. |
| 6,338,984 B2 | 1/2002 | Minamio et al. |
| 6,498,099 B1 | 12/2002 | McLellan et al. |
| 6,545,347 B2 | 4/2003 | McClellan |
| 6,585,905 B1 | 7/2003 | Fan et al. |
| 6,593,643 B1 | 7/2003 | Seki et al. |
| 6,608,366 B1 | 8/2003 | Fogelson et al. |
| 6,638,790 B2 | 10/2003 | Minamio et al. |
| 6,664,136 B2 | 12/2003 | Motonami et al. |
| 6,734,044 B1 | 5/2004 | Fan et al. |
| 6,841,414 B1 | 1/2005 | Hu et al. |
| 6,872,599 B1 | 3/2005 | Li et al. |
| 6,940,154 B2 | 9/2005 | Pedron et al. |
| 7,071,545 B1 | 7/2006 | Patel et al. |
| 7,091,581 B1 | 8/2006 | McLellan et al. |
| 7,183,630 B1 | 2/2007 | Fogelson et al. |
| 7,247,526 B1 | 7/2007 | Fan et al. |
| 7,262,491 B2 | 8/2007 | Islam et al. |
| 7,405,468 B2 * | 7/2008 | Masuda ............... H01L 21/565 |
| | | | 257/676 |
| 7,443,043 B2 | 10/2008 | Sakamoto |
| 7,635,910 B2 | 12/2009 | Sinaga et al. |
| 7,786,557 B2 | 8/2010 | Hsieh |
| 7,846,774 B2 | 12/2010 | Yee et al. |
| 7,875,963 B1 | 1/2011 | Kim et al. |
| 8,089,166 B2 | 1/2012 | Kim |
| 8,318,340 B2 | 11/2012 | Stimits |
| 8,444,840 B2 | 5/2013 | Stimits et al. |
| 8,648,474 B2 | 2/2014 | Nondhasittichai et al. |
| 8,994,160 B2 * | 3/2015 | Kimura ............ H01L 23/49548 |
| | | | 257/666 |
| 2002/0067486 A1 | 6/2002 | S. Forney et al. |
| 2002/0144396 A1 | 10/2002 | Glenn |
| 2004/0142505 A1 * | 7/2004 | Huang ............... H01L 21/4832 |
| | | | 438/106 |
| 2005/0003586 A1 | 1/2005 | Shimanuki et al. |
| 2005/0093117 A1 * | 5/2005 | Masuda ............... H01L 21/565 |
| | | | 257/676 |
| 2005/0116321 A1 | 6/2005 | Li et al. |
| 2005/0139982 A1 | 6/2005 | Fukaya et al. |
| 2005/0206010 A1 | 9/2005 | Noquil et al. |
| 2007/0126092 A1 | 6/2007 | San Antonio et al. |
| 2007/0176267 A1 | 8/2007 | Abbott |
| 2008/0001263 A1 | 1/2008 | Dimaano et al. |
| 2008/0226976 A1 | 9/2008 | Stimits |
| 2008/0258273 A1 | 10/2008 | Liang et al. |
| 2008/0290484 A1 | 11/2008 | Low et al. |
| 2009/0160037 A1 | 6/2009 | Bayan et al. |
| 2009/0289335 A1 | 11/2009 | Camacho et al. |
| 2011/0115061 A1 | 5/2011 | Krishnan et al. |
| 2011/0244629 A1 | 10/2011 | Gong et al. |
| 2012/0043660 A1 * | 2/2012 | Poddar ............... H01L 21/568 |
| | | | 257/773 |
| 2012/0112333 A1 | 5/2012 | Liu et al. |
| 2013/0320527 A1 * | 12/2013 | Sunaga ............... H01L 23/3114 |
| | | | 257/737 |
| 2016/0056097 A1 * | 2/2016 | Bai ................... H01L 23/49582 |
| | | | 257/670 |
| 2016/0254217 A1 * | 9/2016 | Lu .................... H01L 23/49568 |
| | | | 257/675 |
| 2017/0263537 A1 | 9/2017 | Suzuhara |

OTHER PUBLICATIONS

"Soldering the QFN Stacked Die Sensors to a PC Board," by Thomas Koschmieder, Cheol Han, Kimberly Tuck, and John Dixon, Freescale Semiconductor Application Note AN 3111, Rev 5, Apr. 2010, 9 Pages.

* cited by examiner

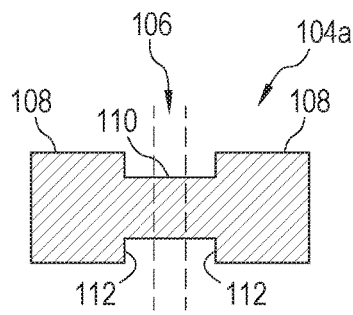
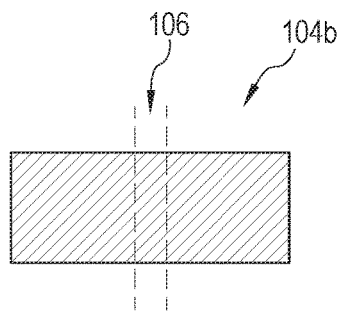
*FIG. 2c*  *FIG. 2d*
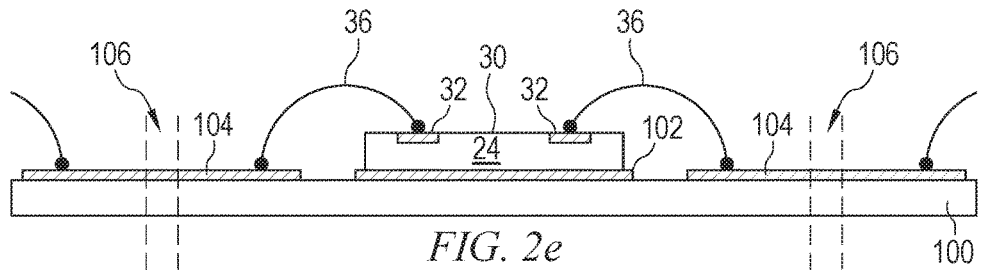
*FIG. 2e*
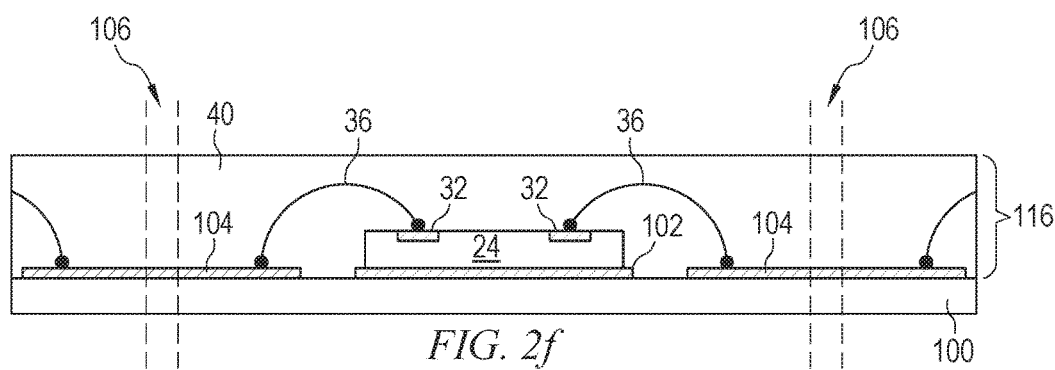
*FIG. 2f*
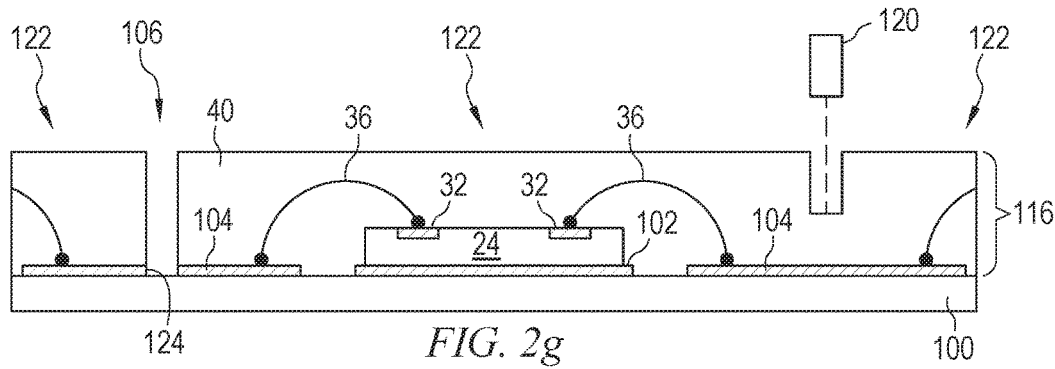
*FIG. 2g*

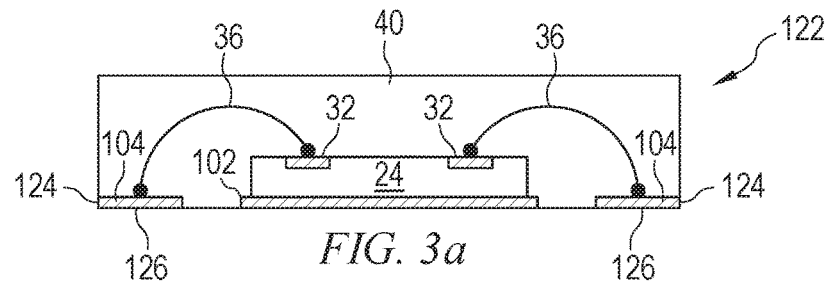
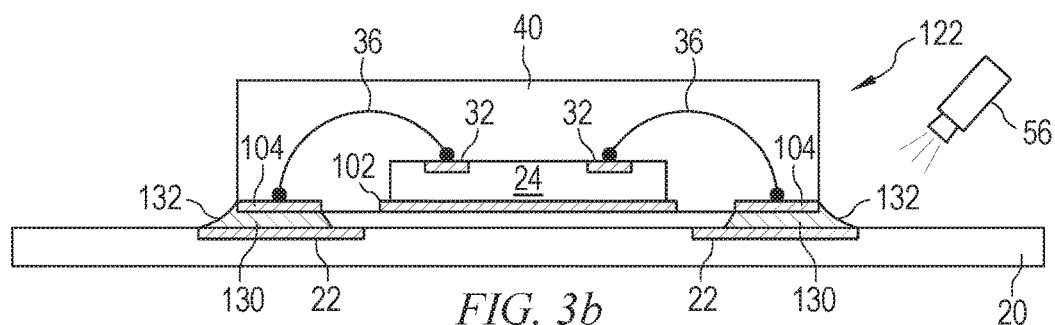
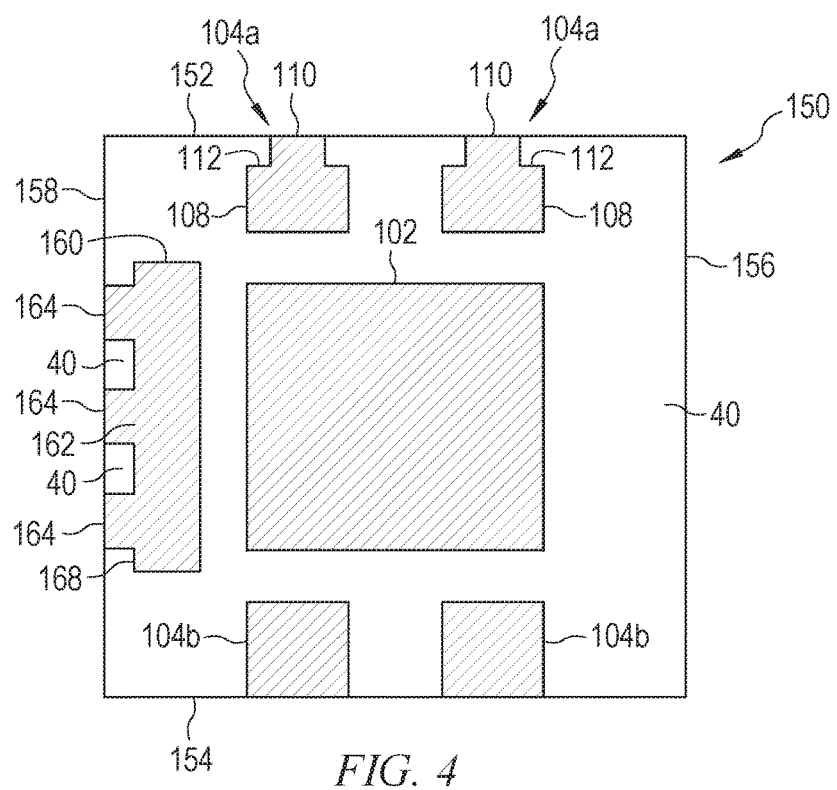

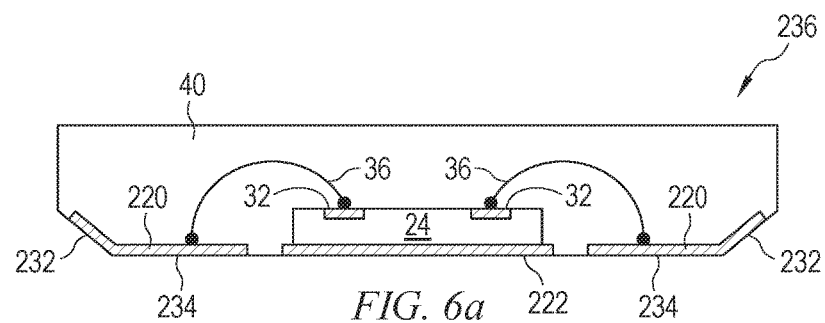
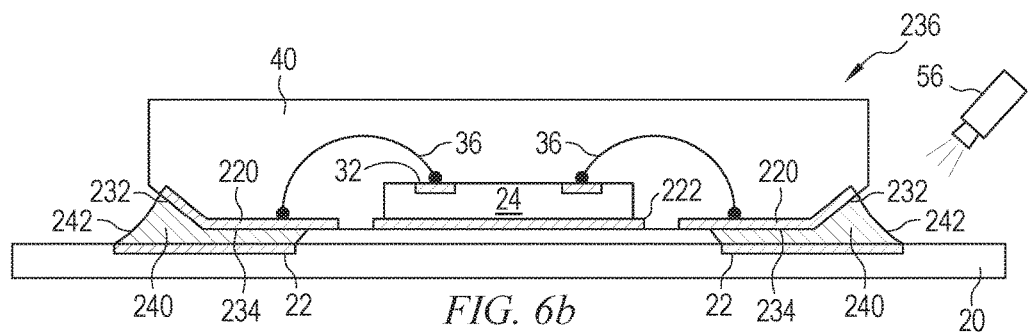

US 10,163,766 B2

METHODS OF FORMING LEADLESS SEMICONDUCTOR PACKAGES WITH PLATED LEADFRAMES AND WETTABLE FLANKS

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), power conversion, standard logic, amplifiers, clock management, memory, interface circuits, and other signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices are desirable for enabling manufacture of smaller end products. A smaller semiconductor device size can be achieved by improvements in the front-end process resulting in semiconductor die with smaller, higher density active and passive components. Back-end processes may result in semiconductor device packages with a smaller footprint or height by improvements in electrical interconnection and packaging materials.

FIG. 1a illustrates a conventional leadless package 10 as a quad flat no-lead (QFN) or dual flat no-lead (DFN) package. Leadless package 10 includes a semiconductor die 24 disposed on a leadframe 26. Leadframe 26 is formed from a metallic substrate with material of the substrate removed to create a plurality of leads 26a surrounding a die pad 26b. Semiconductor die 24 is disposed on die pad 26b and includes contact pads coupled to leads 26a by bond wires 36. An encapsulant or molding compound 40 is disposed around semiconductor die 24 and leadframe 26 for electrical isolation and protection from contaminants.

Leadless package 10 is mounted to a printed circuit board (PCB) or other substrate 20. Solder 50 is reflowed between leadframe contacts 26a and contact pads 22 on PCB 20 to form a metallurgical and electrical connection between leadless package 10 and the PCB. Leadless package 10 includes leads 26a for external interconnection, which are simply portions of a metal leadframe exposed from the final package. Leads 26a are used instead of leads that extend from the package laterally and/or vertically as in traditional semiconductor package types. The exposed wettable material of contacts 26a on the lateral surfaces of package 10 allows solder 50 to form filleted surfaces 52 after leadless package 10 is mounted onto PCB 20.

Fillets 52 are useful to manufacturers of electronic devices because proper interconnection between semiconductor die 24 and PCB 20 can be verified visually by a human or by an automatic visual inspection device 56 including a camera and a computer programmed to analyze the images. If a visual inspection shows that a proper fillet 52 was not formed for one of the connections of a lead 26a to a contact pad 22, an error in the specific PCB 20 is recorded. If visual inspection device 56 verifies that each connection between leadless package 10 and PCB 20 includes a proper fillet 52, the manufacturer can have confidence that the package is properly connected to the system as a whole.

Leadless package 10 reduces the footprint required on PCB 20 over many prior art packages by not having leads that extend from the package, and instead having leads 26a that remain within the footprint of the package body. Leadless packages have been further reduced in size by reducing a thickness of the leadframe. The substrate material of leadframe 26 must be thick enough to support semiconductor die 24 during the manufacturing process. FIG. 1b illustrates a leadless package 60 with a plated leadframe 66, which is significantly thinner than leadframe 26 of leadless package 10. Leadframe 66 is similar to leadframe 26, but is formed by plating the leadframe on a separate sacrificial substrate for physical support.

Leadframe 66 is not relied upon to provide physical support for semiconductor die 24 during formation of leadless package 60 because of support from the sacrificial substrate, so leadframe 66 can be plated as a relatively thin layer. The thinner leadframe 66 results in a final leadless package 60 that is thinner than leadless package 10. However, the reduced thickness of leadframe 66 also results in a concomitant reduction in adhesion between the leadframe and encapsulant 40. To increase adhesion, manufacturers form contacts 66a that do not extend fully to the lateral edges of package 60.

Encapsulant 40 fully surrounds contacts 66a in plated leadless packages to increase contact area and mold lock between the encapsulant and the leadless contacts. However, without contacts 66a exposed at the flanks of leadless package 60, solder 70 does not form a fillet easily visible when the leadless package is mounted on PCB 20. The sides of package 60 do not include wettable surfaces for solder 70 to reflow onto. While forming a leadless package with a plated leadframe results in a thinner semiconductor package for a potentially smaller end product, installation of the package does not form filleted solder connections. The resulting connection of solder 70 between leadless package 60 and PCB 20 is more difficult to verify with visual inspection device 56, and may require other technology, such as x-ray devices, to properly verify.

Therefore, a need exists for a method of forming a leadless package using a plated leadframe that also has wettable flanks to form a filleted solder connection.

BRIEF DESCRIPTION OF THE DRAWINGS

FIGS. 2a-2g illustrate forming a leadless package having a plated leadframe and wettable flanks;

FIGS. 3a-3b illustrate the leadless package with wettable flanks installed on a printed circuit board and the solder connection forming a fillet;

FIG. 4 illustrates various lead configurations applicable to the leadless package;

FIGS. 6a-6b illustrate the package formed using the ridged substrate installed on a PCB with a filleted solder connection;

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure.

Figure 1A:
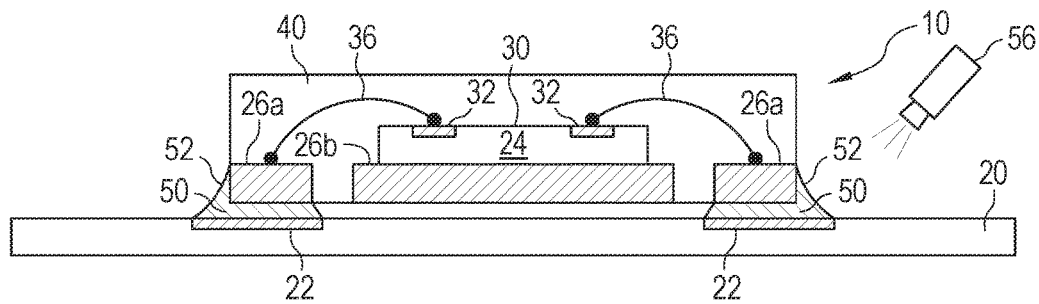
FIGS. 1a-1b illustrate leadless semiconductor packages.
Figure 1B:
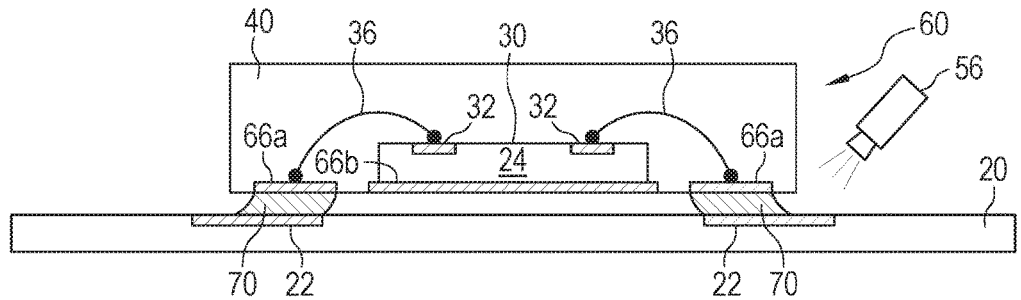
Figure 2A:
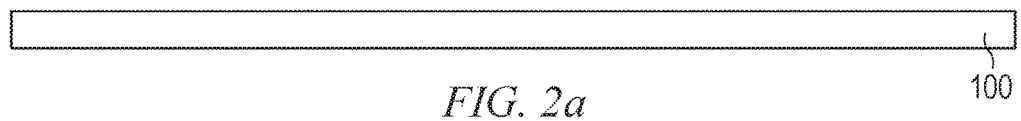

FIG. 2a shows a cross-sectional view of a portion of a carrier or sacrificial substrate 100 containing sacrificial base material such as silicon (Si), polymer, beryllium oxide, glass, copper (Cu), aluminum (Al), or other suitable rigid material for structural support. In other embodiments, substrate 100 includes a flexible material sufficient to support plating of a leadframe. Substrate 100 can be a round or rectangular panel with capacity for multiple semiconductor die 24.

Figure 2B:
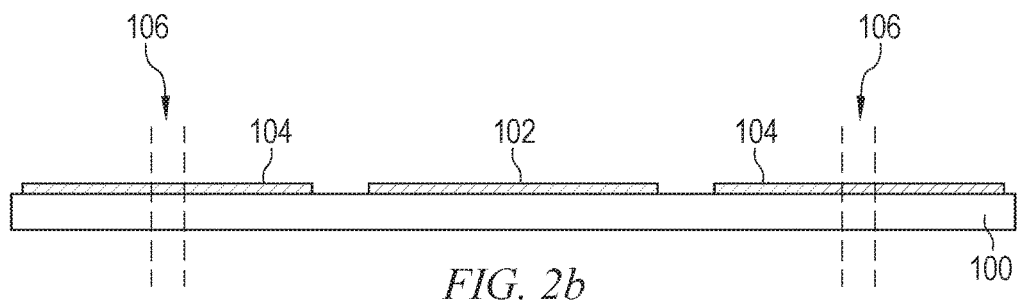

In FIG. 2b, an electrically conductive layer including die pad 102 and contacts 104 is formed over substrate 100 using PVD, CVD, electrolytic plating, electroless plating, or other suitable metal deposition process. Conductive layer 102-104 contains one or more layers of Al, Cu, tin (Sn), nickel (Ni), gold (Au), silver (Ag), or other suitable electrically conductive material. In some embodiments, a mask layer is deposited over substrate 100 and patterned using photolithography prior to depositing metal for conductive layer 102-104. In other embodiments, metal is deposited over an entire surface of substrate 100 and then patterned into contacts 104 and die pad 102. Other additive, semi-additive, or subtractive methods for forming die pad 102 and contacts 104 are usable as desired. In one embodiment, die pad 102 and contacts 104 are formed by depositing a thin layer of Au, which will be exposed when substrate 100 is removed, a thicker layer of Ni over the layer of Au, and finally a thin layer of Ag over the Ni for wire bonding. Die pad 102 and contacts 104 can be formed from any material or plating stack that is solderable and able to withstand the removal process of substrate 100. In some embodiments, die pad 102 and contacts 104 are plated to a thickness of 60 μm. In other embodiments, die pad 102 and contacts 104 are plated thicker, e.g., 100 μm, to increase mold lock with encapsulant 40 and provide an increased thickness wettable flank.

Each contact pad 104 extends across an inter-die area or saw street 106. FIG. 2c illustrates a plan view of one embodiment of contact pad 104 as contact pad 104a. Each contact pad 104a includes two bond pads 108 attached by a neck portion 110. Each bond pad 108 in FIG. 2c is associated with a different semiconductor die 24 that will be disposed on two adjacent die pads 102. When singulated through saw street 106, a portion of neck 110 of each contact 104a is exposed at the sides of the devices created by singulation as a wettable flank. Shoulders 112 remain embedded in encapsulant 40 to increase mold lock between encapsulant 40 and contacts 104a.

Contacts 104b in FIG. 2d are rectangular, with the contact having a uniform width along the length of the contact, including through saw street 106. Contact 104b results in a wettable flank with essentially the same width as bond pad 108, while contact 104a in FIG. 2c includes a reduced width wettable flank due to neck 110 being thinner through saw street 106 than the width of bond pads 108. Other shapes for contacts 104 are used in other embodiments.

In FIG. 2e, semiconductor die 24 is disposed on die pad 102 using, e.g., a pick-and-place operation. Semiconductor die 24 is disposed on die pad 102 with active surface 30 oriented away from carrier 100. Contact pads 32 are exposed for wirebonding to contacts 104. A plurality of bond wires 36 is formed between contacts 104 on substrate 100 and contact pads 32 of semiconductor die 24. Bond wires 36 are mechanically and electrically coupled to contacts 104 and contact pads 32 by thermocompression bonding, ultrasonic bonding, wedge bonding, stitch bonding, ball bonding, or other suitable bonding technique. Bond wires 36 include a conductive material such as Cu, Al, Au, Ag, or a combination thereof. Bond wires 36 represent one type of interconnect structure that electrically connects contacts 104 to contact pads 32. In another embodiment, conductive bumps are formed on contact pads 32, and semiconductor die 24 is flip-chip bonded onto contacts 104 without die pad 102. Semiconductor die 24 may include a two-terminal device such as a diode, a three terminal device such as a transistor, or a device with more terminals. In other embodiments, a discrete passive device, or a plurality of integrated passive devices formed over a substrate, are used instead of or in addition to semiconductor die 24.

In FIG. 2f, an encapsulant or molding compound 40 is deposited over semiconductor die 24, bond wires 36, and substrate 100 as an insulating material using a paste printing, compressive molding, transfer molding, liquid encapsulant molding, vacuum lamination, spin coating, or other suitable applicator. Encapsulant 40 covers the side surfaces and active surface 30 of semiconductor die 24. Encapsulant 40 can be polymer composite material, such as epoxy resin with filler, epoxy acrylate with filler, or polymer with proper filler. Encapsulant 40 is non-conductive and environmentally protects the semiconductor device from external elements and contaminants. Encapsulant 40 also protects semiconductor die 24 from degradation due to exposure to light. Encapsulant 40, semiconductor die 24, die pad 102, contacts 104, and bond wires 36 combine to form a reconstituted wafer or panel 116. Panel 116 may include any desired number of semiconductor die 24 in a two-dimensional grid. Each semiconductor die 24 is disposed on a similar die pad 102, and similar contacts 104 extend between each pair of adjacent semiconductor die.

In FIG. 2g, the panel 116 is singulated through saw streets 106 using a saw blade or laser cutting tool 120 to form a plurality of plated leadless packages 122. Cutting through saw street 106 exposes side surfaces of contacts 104 as wettable flanks 124. FIG. 3a illustrates a leadless package 122 after substrate 100 is removed by chemical etching, mechanical peeling, chemical mechanical planarization (CMP), mechanical grinding, thermal bake, UV light, laser scanning, or wet stripping. In some embodiments, substrate 100 is removed from encapsulant 40, die pads 102, and contacts 104 prior to singulating the panel with cutting tool 120. In one embodiment, package 122 is made using a Maxell process, where substrate 100 is formed of Al and peeled away from panel 116. In another embodiment, package 122 is made using an LLGA process, where substrate 100 is formed of Cu and removed by chemical etching.

Because each contact 104 extends across a saw street 106 between two adjacent semiconductor die 24 in panel 116, singulation into individual leadless packages 122 results in exposed wettable flanks 124 for each contact of the leadless packages. Removing substrate 100 exposes bottom surfaces 126 of each contact 104. In FIG. 3b, leadless package 122 is disposed over PCB 20. Leadless package 122 is mechanically and electrically connected to contact pads 22 of PCB 20 by solder 130. In one embodiment, solder 130 is formed by depositing an electrically conductive material over contacts 104 of leadless packages 122 or contact pads 22 of PCB 20 using an evaporation, electrolytic plating, electroless plating, ball drop, or screen printing process. The material for solder 130 can be Al, Sn, Ni, Au, Ag, lead (Pb), bismuth (Bi), Cu, solder, and combinations thereof, with an optional flux solution. For example, solder 130 can be eutectic Sn/Pb, high-lead solder, or lead-free solder.

Solder 130 is reflowed between contacts 104 of leadless package 122 and contact pads 22 of PCB 20 to electrically and mechanically connect semiconductor die 24 to PCB 20. Reflowing solder 130 creates a good connection of the solder to both contacts 104 and contact pads 22. When solder 130 is reflowed, the solder material wets onto flanks 124 of contacts 104 exposed at the lateral surfaces of leadless package 122. Fillets 132 of solder 130 extend outside a footprint of package 122, and are visible to visual inspection device 56. Visual inspection device 56 is used to verify solder 130 makes a good connection between package 122 and PCB 20 for each contact 104 by visually inspecting fillet 132. Package 122 allows a relatively thin package height by using a plated leadframe, while also providing a wettable flank 124 for a visually verifiable solder fillet.

FIG. 4 illustrates a bottom surface of a leadless package 150. Leadless package 150 is similar to leadless package 122, but includes various exemplary contact configurations. Package 150 includes a first side surface 152 with a plurality of contacts 104a from FIG. 2c. Each contact 104a includes a bond pad 108 exposed from the bottom of package 150, and a neck portion 110 exposed from both the bottom of package 150 and side surface 152 as a wettable flank. Encapsulant 40 extends around bond pads 108 between side surface 152 and shoulders 112 to provide additional mold lock of contacts 104a, while still allowing a portion of the contact to extend to side surface 152 as a wettable flank. While contacts 104a are illustrated with a center portion of each contact extending to side surface 152 of package 150, contacts 104 are formed with a single shoulder 112 formed on one side of neck 110, or with two necks 110 surrounding a single shoulder 112, in other embodiments. Other configurations of having a bond pad 108 with only a portion of the wire bond pad extending to a side surface of a package are used in other embodiments.

A second side surface 154 of package 150 includes rectangular contacts 104b from FIG. 2d. Each contact 104b extends from side surface 154 inward toward die pad 102. While sides 152 and 154 of leadless package 150 are each illustrated as having two contacts 104, zero, one, or more than two contacts are formed on a particular side of a leadless package in other embodiments as desired. For instance, side surface 156 of leadless package 150 does not include any leads. In some embodiments, a dual flat non-leaded package is formed by having two opposite sides of a leadless package include plated leads with wettable flanks, while the remaining two sides include no leads. In other embodiments, quad flat non-leaded packages are formed by having plated leads with wettable flanks on four sides of the packages. Plated leads 104 are formed on any number of sides on any shaped semiconductor package that is desired. Each side of die pad 102 may have identical or different lead configurations.

Side surface 158 of leadless package 150 includes a single larger plated lead 160. Lead 160 includes three necks 164 that each extend to side surface 158. Necks 164 allow encapsulant 40 to flow into the space between the necks to improve adhesion of the encapsulant to lead 160. Lead 160 includes shoulders 168 at each end of the lead, but necks 164 are formed at the ends of lead 160 in other embodiments. Contact 160 results in three filleted solder connections at side surface 158 of leadless package 150 for one electrical connection. Visual inspection device 56 is programmable to verify any number of solder fillets at any number of sides of package 150.

Figure 5A:
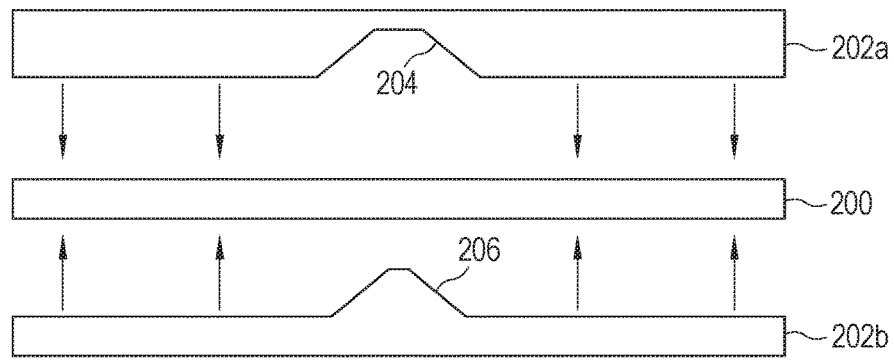
FIGS. 5a-5h illustrate using a ridged substrate to form wettable flanks.
Figure 5B:
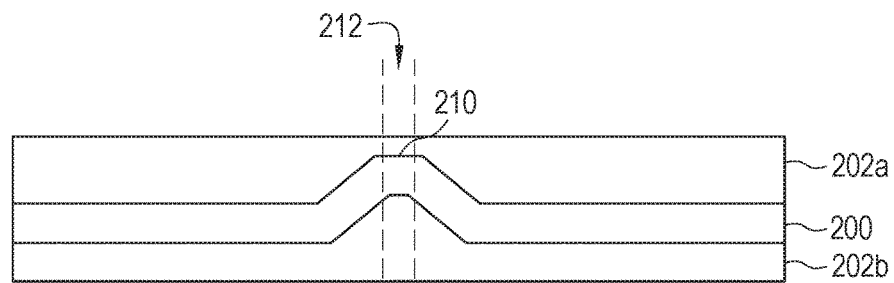

FIGS. 5a-5h illustrate forming a leadless semiconductor package by using a ridged substrate 200. Substrate 200 is similar to substrate 100 from FIG. 2a, and is formed from Al or Cu in some embodiments. In FIG. 5a, substrate 200 is placed into a press 202. Press 202 includes an upper plate 202a with a concave recess 204, and a lower plate 202b with a corresponding convex ridge 206. In FIG. 5b, press 202 is closed on substrate 200 and applies a force to shape portions of the substrate into ridges 210. Ridge 210 is imprinted into substrate 200 by pressing the substrate between plates 202a and 202b. In some embodiments, heat is applied to aid in forming ridge 210 in substrate 200.

Figure 5C:
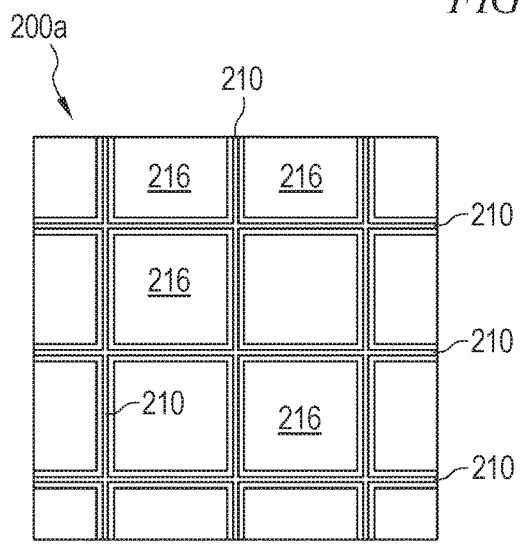
Figure 5D:
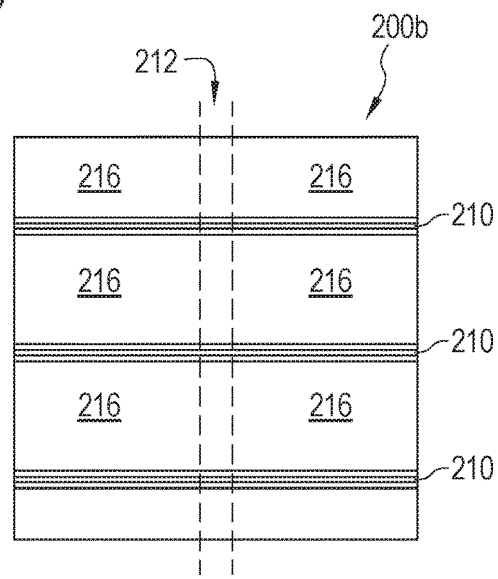

Contacts for the leadframe will be formed on ridge 210, so a ridge 210 is formed on each side of location where a die pad will be formed on substrate 200. FIG. 5c illustrates a substrate 200a with both horizontal and vertical ridges 210 formed around each die attach area 216. Die attach area 216 indicates a location on substrate 200 where a die pad will be plated. Wire bond pads will be formed partially in the area 216 and extending onto ridges 210. As illustrated in FIG. 5c, a semiconductor die 24 disposed in an area 216 will be surrounded on four sides by ridges 210, resulting in wettable flanks being formed on four sides of the die. FIG. 5d illustrates substrate 200b with ridges 210 oriented in only a single direction. A semiconductor die disposed in an area 216 of substrate 200b will have ridges 210 on two opposite sides of the die, resulting in wettable flanks on two side of the die. In another embodiment, two die are disposed between ridges 210 in FIG. 5d, and each die has a ridge on only one side. While ridges 210 are illustrated extending the entire length or width of substrate 200, other embodiments have a plurality of ridges 210 at the specific locations where leads with wettable flanks are desired.

Figure 5E:
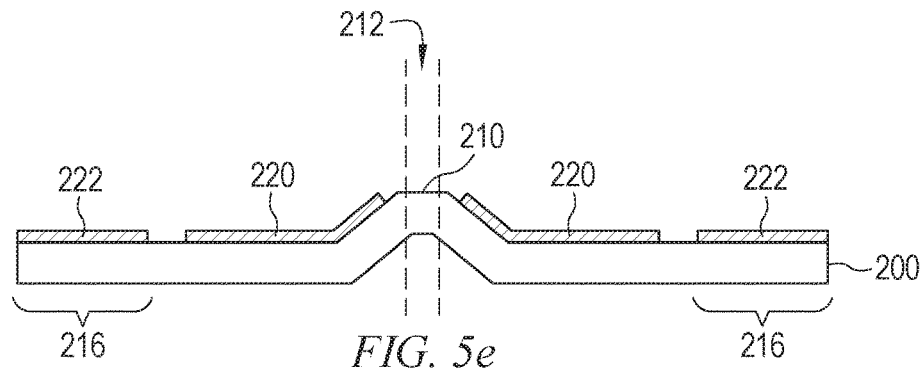
Figure 5F:
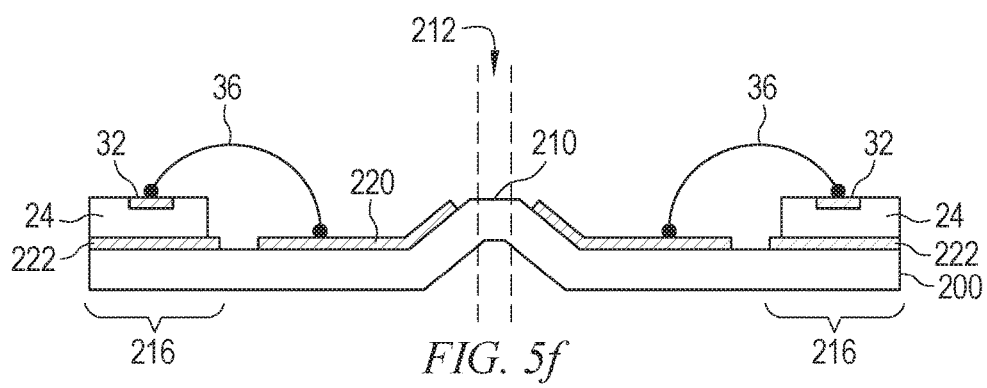
Figure 5G:
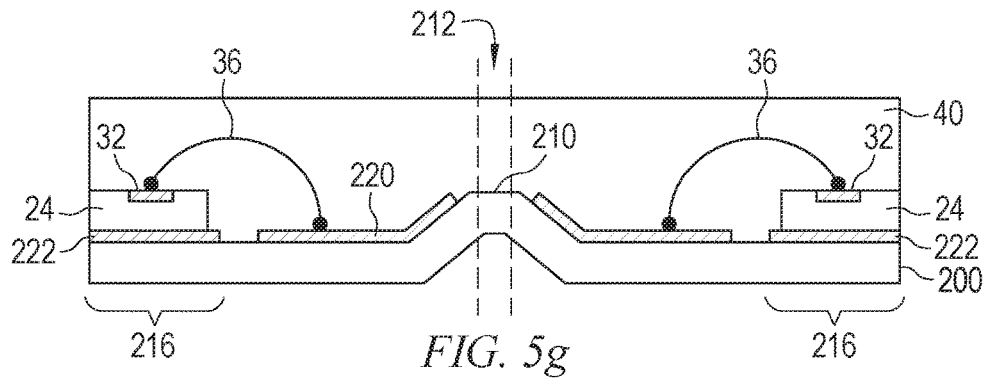

FIG. 5e illustrates a cross-sectional view of a portion of substrate 200 with contacts 220 and die pads 222 formed over the substrate. Die pads 222 and contacts 220 are similar to die pad 102 and contacts 104. Die pads 222 are formed within die attach area 216 of substrate 200. Each contact 220 extends partially up ridge 210 to flank saw street 212. In FIG. 5f, semiconductor die 24 are disposed on die pads 222, and contact pads 32 are coupled to contacts 220 by wire bonds 36. Encapsulant 40 is deposited over substrate 200 in FIG. 5g to create a panel.

Figure 5H:
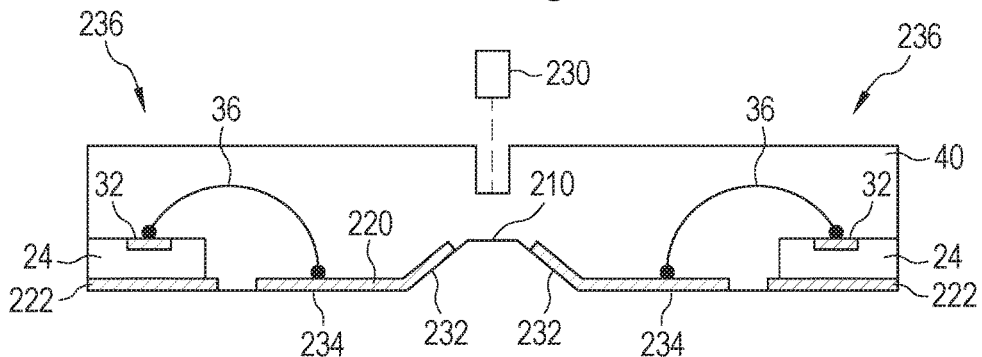

In FIG. 5h, substrate 200 is removed from the panel, e.g., by chemical etching or mechanical peeling, and the panel is singulated into a plurality of individual leadless devices 236. With substrate 200 removed, each contact 220 includes a wettable flank 232 and an exposed bottom portion 234. While FIG. 5h illustrates substrate 200 removed prior to singulation, the substrate may be removed after singulating the individual devices 236.

FIG. 6a illustrates an individual leadless package 236 after singulation. In FIG. 6b, leadless package 236 is mounted to PCB 20 using solder 240 for electrical and mechanical connection. Solder 240 is reflowed between contacts 220 and contact pads 22, and forms a filleted surface 242 between contact pads 22 and wettable flanks 232. Ridge 210 of substrate 200 modified the shape of contact 220 and encapsulant 40 to provide a bottom surface of package 236 that is raised at the edges of the packages where contacts are formed. The raised edges of package 236 provide additional space for solder 240 to fill, and visual inspection device 56 is able to visibly verify that solder 240 extends properly between leadless package 236 and PCB 20 for each contact 220. An angle of the sloped sides of ridge 210 is customizable to provide a larger fillet when a steeper ridge is used, or to make a thinner package with less of a fillet when a more gradual slope is used for ridge 210.

Figure 7A:
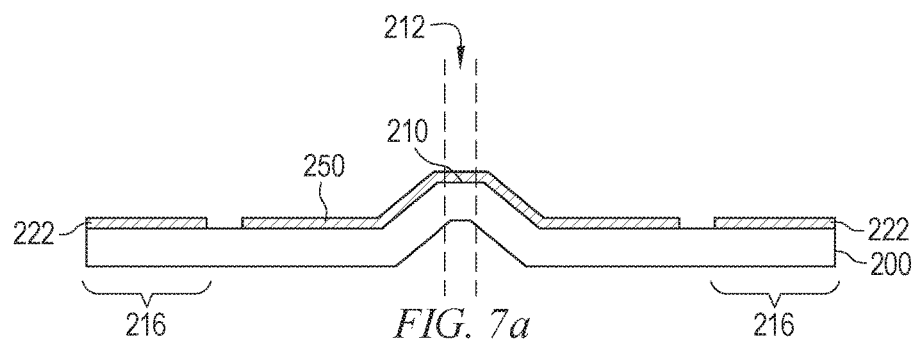
FIGS. 7a-7b illustrate forming a leadless package with a ridged substrate and leads exposed at the side surfaces of the package.
Figure 7B:
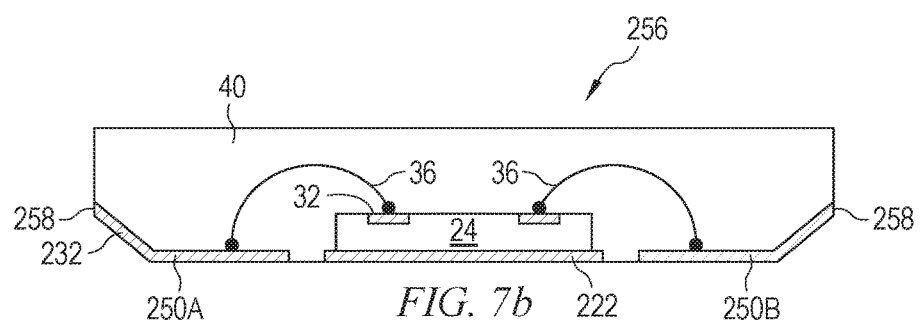

Using a ridged substrate 200 to provide for fillets 242 allows solder fillets to be formed on a plated leadframe while still having encapsulant 40 fully surround the edges of contacts 220 for added adhesion of the contacts to the package. However, FIG. 7a illustrates another embodiment with contact 250 disposed across saw street 212 between two die attach areas 216. Contacts 250 are similar to contacts 104, and can similarly take on a variety of shapes. Singulating devices 256 formed with contacts 250, as shown in FIG. 7b, results in sloped flanks 232, as with leadless package 236, and also a side surface of each contact being exposed from encapsulant 40 as wettable flank 258. When leadless package 256 is mounted on PCB 20 or another substrate, solder used to mount the package reflows up the sloped edges at sloped flanks 232 and onto the side surface of the package at lateral flanks 258. Package 256 with contacts 250 exposed at side surfaces of the package increases the total size of the solder fillet, thus allowing ridge 210 to be formed with a smaller slope. The smaller slope of ridge 210 allows for a thinner end product.

Figure 8A:
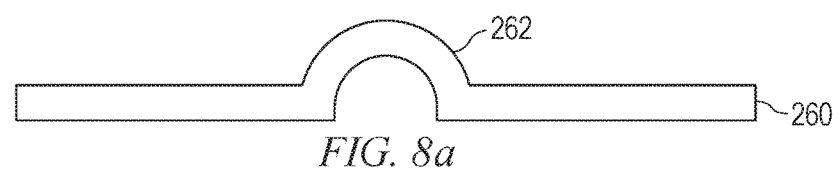
FIGS. 8a-8b illustrate forming the leadless package with a substrate having a rounded ridge.
Figure 8B:
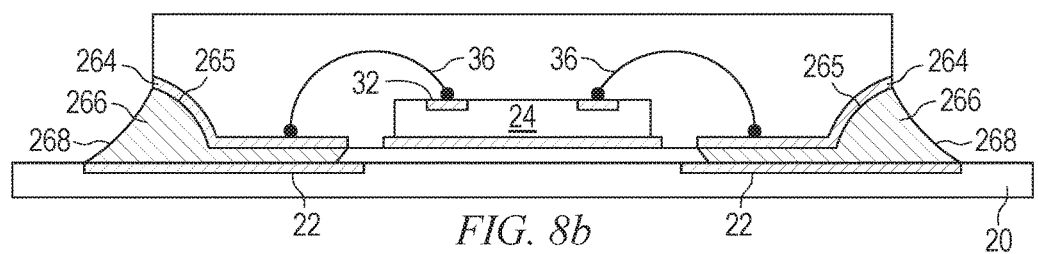

Other shapes of a ridged substrates are used in other embodiments. FIG. 8a illustrates a substrate 260 with a rounded ridge 262 pressed into the substrate. In FIG. 8b, rounded ridge 262 results in a leadless package with curved contacts 264 having wettable flanks 265. Solder 266 fills the space between wettable flanks 265 and contact pads 22 to form fillets 268. While the leadless package of FIG. 8b was formed with contacts 264 extending completely over ridge 262, similar to contact 250 in FIG. 7a, a rounded ridge 262 could also be used with plated contacts that do not extend across a saw street similar to contacts 220 in FIG. 5e.

Figure 9A:
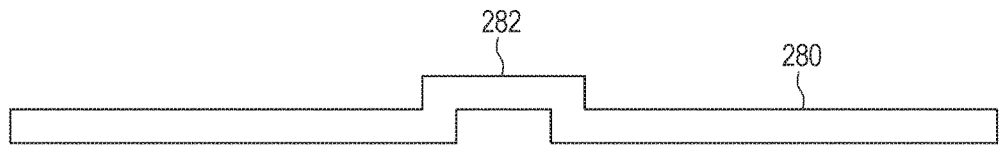
FIGS. 9a-9b illustrate forming the leadless package with a substrate having a rectangular ridge.
Figure 9B:
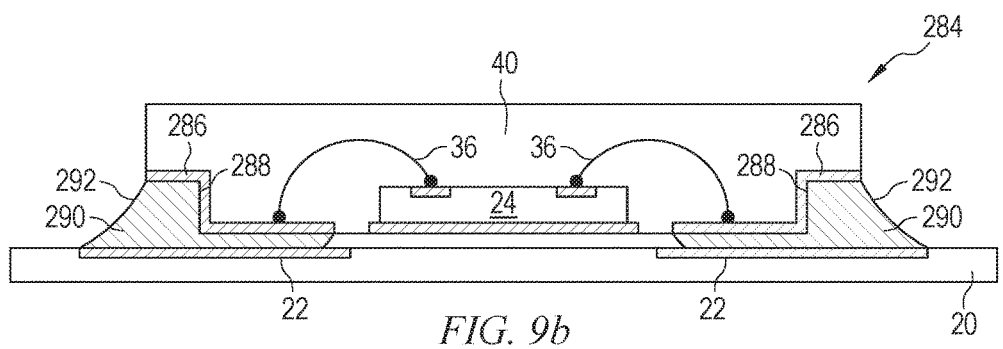

FIG. 9a illustrates a substrate 280 with rectangular ridge 282 pressed into the substrate. Ridge 282 results in a device 284 in FIG. 9b having contacts 286 with approximately 90-degree angle bends and a square or rectangular wettable flank 288. Solder 290 fills the space between wettable flank 288 and contact pad 22 to form fillets 292. While leadless package 284 was formed with contacts 286 extending completely over ridge 282, similar to contact 250 in FIG. 7a, a rectangular ridge 282 could also be used with plated contacts that do not extend across a saw street similar to contacts 220 in FIG. 5e.

Figure 10:
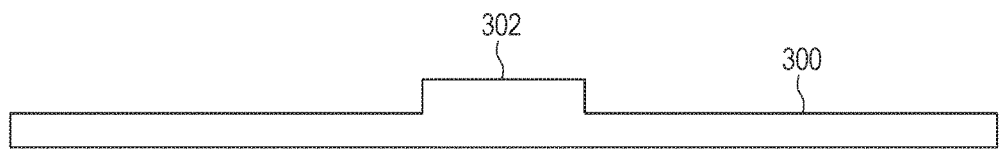
FIG. 10 illustrates a substrate with an etched ridge for forming the leadless package with wettable flanks.

In addition to being formed in a variety of possible shapes, ridged substrates may be formed in a variety of methods. FIG. 10 illustrates an etched substrate 300 with ridge 302. Substrate 300 is formed by providing a substrate with a uniform thickness, and etching portions of the substrate away from desired locations for ridge 302. After substrate 300 is etched to form ridge 302, the substrate includes additional material where ridge 302 is located. Therefore, removal of substrate 300 from the encapsulated leadframe by etching may take additional etch time over ridge 302.

In other embodiments, the formation of ridge 302 includes an etching step on the bottom of substrate 300 to remove material under ridge 302, thus creating a substrate 300 having a more uniform distribution of material. Ridge 302 can be etched into any desired shape to customize the shape of a resulting wettable flank, e.g., round, rectangular, or sloped. Ridge 302 could also be formed only at the specific locations where package contacts are to be formed, rather than extending uniformly across substrate 300. Ridge 302 can be etched in any of the above-disclosed shapes, and any of the above-disclosed contact configurations are usable with leadframe 300.

Figure 11:
FIG. 11 illustrates a substrate with a deposited ridge for forming the leadless package with wettable flanks.

FIG. 11 illustrates substrate 310, which includes flat surfaces extending completely across the substrate on both the top and bottom. A ridge 312 is formed by depositing material over substrate 310. The material for ridge 312 may be the same or a different material from the material for substrate 310. In one embodiment, ridge 312 is formed using a photoresist layer. In some embodiments, ridge 312 is removed from the encapsulated devices using a separate etching step from substrate 310 to leave a device having wettable flanks in the shape of the ridge. Material for ridge 312 can be deposited in any desirable shape to form a device with any desired shape of wettable flank, and may be formed only at locations where package contacts are to be formed.

While one or more embodiments have been illustrated and described in detail, the skilled artisan will appreciate that modifications and adaptations to those embodiments may be made without departing from the scope of the present disclosure.

What is claimed is:

1. A method of making a semiconductor device, comprising:
   providing a substrate;
   forming a ridge in the substrate;
   forming a contact over the ridge on the substrate;
   depositing an encapsulant over the contact and substrate;
   singulating through the encapsulant and contact; and
   removing the substrate to expose a surface of the contact.

2. The method of claim 1, further including forming the contact by plating a metal layer onto the substrate.

3. The method of claim 1, further including forming the ridge using a press.

4. The method of claim 1, further including forming the contact to include a neck across an area of singulation.

5. The method of claim 1, further including reflowing a solder over the contact to form a solder fillet extending from a side surface of the contact.

6. The method of claim 1, further including disposing a semiconductor die over the substrate.

7. The method of claim 6, wherein a side surface of the contact is exposed by singulating the contact.

8. A method of making a semiconductor device, comprising:
   providing a substrate including a ridge;
   forming a first contact over a portion of the ridge;
   depositing an encapsulant over the first contact and substrate;
   singulating through the encapsulant over the ridge; and
   removing the substrate to expose the first contact.

9. The method of claim 8, further including forming the ridge using a press.

10. The method of claim 8, further including forming the ridge by depositing a material over the substrate.

11. The method of claim 8, further including:
    forming a second contact over the ridge adjacent to the first contact;
    depositing the encapsulant over the second contact; and
    singulating the encapsulant between the first contact and second contact.

12. The method of claim 8, further including forming the contact extending completely over the ridge.

13. The method of claim 8, further including forming the contact to include a neck.

14. The method of claim 8, further including removing the substrate by mechanical peeling or chemical etching.

15. A method of making a semiconductor device, comprising:
    providing a substrate;
    forming a ridge in the substrate;
    forming a plated contact on the substrate;
    depositing an encapsulant over the plated contact and substrate;
    singulating through the encapsulant over the ridge; and
    removing the substrate to expose a bottom surface of the plated contact.

16. The method of claim 15, wherein the plated contact includes a slope.

17. The method of claim 15, further including providing a solder fillet extending from the plated contact outside a footprint of the encapsulant.

18. The method of claim 17, wherein the solder fillet extends from the plated contact to a contact pad of the substrate.

19. The method of claim 15, wherein the plated contact includes a neck.

* * * * *